United States Patent [19]
Ishii et al.

[11] Patent Number: 5,896,317
[45] Date of Patent: Apr. 20, 1999

[54] NONVOLATILE SEMICONDUCTOR MEMORY DEVICE HAVING DATA LINE DEDICATED TO DATA LOADING

[75] Inventors: Motoharu Ishii; Shinichi Kobayashi, both of Hyogo; Akinori Matsuo; Masashi Wada, both of Tokyo, all of Japan

[73] Assignee: Mitsubishi Denki Kabushiki Kaisha, Tokyo, Japan

[21] Appl. No.: 08/852,353

[22] Filed: May 7, 1997

[30] Foreign Application Priority Data

May 10, 1996 [JP] Japan .................................. 8-116482

[51] Int. Cl.$^6$ .................................................. G11C 7/00
[52] U.S. Cl. ........................ 365/185.23; 365/185.12; 365/189.05
[58] Field of Search ...................... 365/185.23, 185.12, 365/189.01, 189.05

[56] References Cited

U.S. PATENT DOCUMENTS 5,541,879  7/1996  Suh et al. ............................ 365/185.22
5,712,818  1/1998  Lee et al. ............................ 365/185.05

FOREIGN PATENT DOCUMENTS 1-82392  3/1989  Japan .

*Primary Examiner*—Vu A. Le
*Attorney, Agent, or Firm*—McDermott, Will & Emery

[57] ABSTRACT

It is assumed that, in each memory cell array, a first bit line corresponds to a selected address. In this case, a potential on only the first bit line attains H-level. Data to be loaded is supplied to a latch circuit corresponding to the first bit line through a data line arranged independently of the bit line. All the bit lines are reset upon every completion of loading of data of 1 byte. Therefore, rapid data reading can be performed even when data is to be read from a memory cell array immediately after the data is loaded into a latch circuit, or destruction of data already loaded into the latch circuit can be prevented. Further, a circuit area can be reduced.

4 Claims, 7 Drawing Sheets

NONVOLATILE SEMICONDUCTOR MEMORY DEVICE HAVING DATA LINE DEDICATED TO DATA LOADING

BACKGROUND OF THE INVENTION

1. Field of the Invention

The present invention relates to a nonvolatile semiconductor memory device, and in particular to a nonvolatile semiconductor memory device having a page mode for simultaneously writing a plurality of data into a plurality of memory cells, respectively.

2. Description of the Background Art

Figure 5:
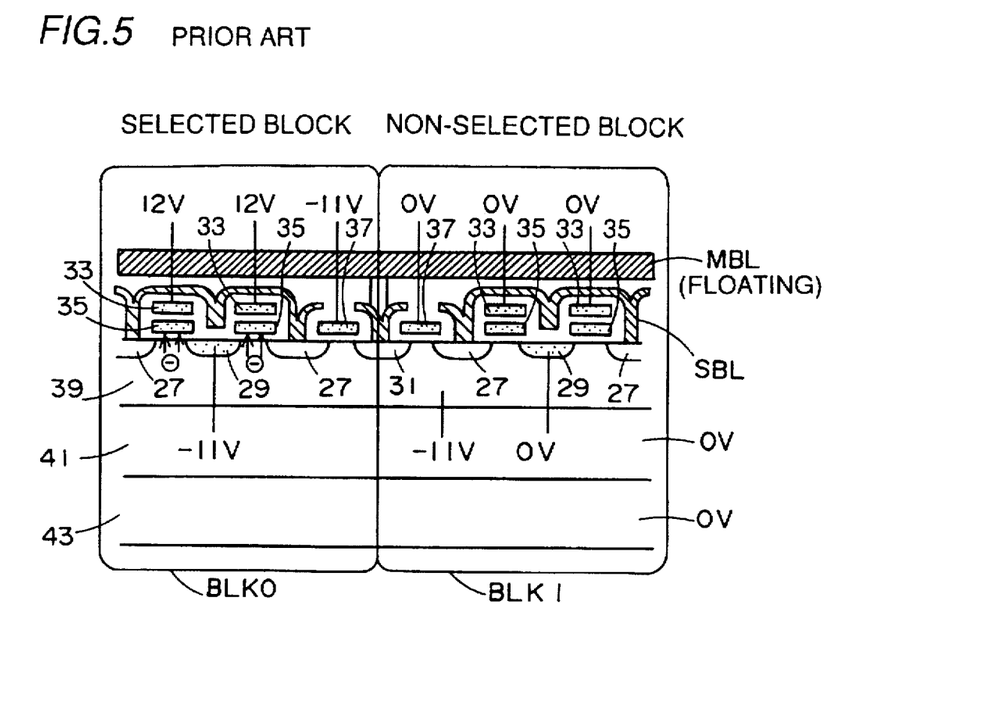
FIG. 5 shows an erase operation in a conventional DINOR flash memory.
Figure 6:
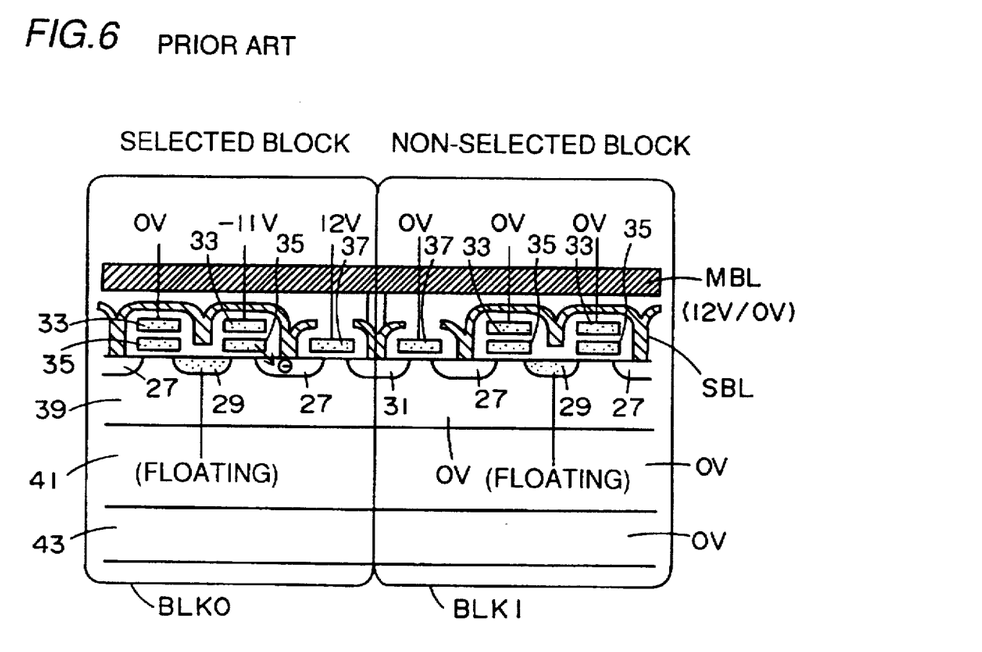
FIG. 6 shows a write operation in the conventional DINOR flash memory.

FIG. 5 shows an erasing method (operation) of a DINOR (Divided Bit Line NOR) type flash memory, which will be referred to as a DINOR flash memory and will be described below as an example of a nonvolatile semiconductor memory device in the prior art. FIG. 6 shows a writing method (operation) of the DINOR flash memory which will be described below as an example of the nonvolatile semiconductor memory device in the prior art. Referring to FIGS. 5 and 6, a memory cell of the DINOR flash memory include a P-type well 39, an $N^+$ layer 27 formed at the surface of P-well 39 and serving as a drain, an $N^+$ layer 29 formed at the surface of P-well 39 and serving as a source, a floating gate 35 formed on P-well 39 with a gate oxide film (not shown) therebetween, and a control gate 33 formed on floating gate 35 with an insulating film (not shown) therebetween. The memory cell having the above structure are generally called a stacked gate memory cells. The memory cell may be called a "memory cell transistor" in some cases.

A select transistor includes a P-well 39, $N^+$ layers 27 and 31 formed on P-well 39, and a select gate 37 formed on P-well 39 with a gate oxide film (not shown) therebetween. P-well 39 is formed at a surface of an N-well 41 formed at a main surface of a P-type semiconductor substrate 43. Each of blocks BLK0 and BLK1 includes two memory cells, one select transistor, a main bit line MBL and a sub-bit line SBL. For the sake of illustration, FIGS. 5 and 6 each show two blocks BLK0 and BLK1, each of which includes two memory cells. In practice, however, the blocks are more than two in number, and each block includes more than two memory cells.

The memory cell has a two-layer structure as described above. The gate oxide film under floating gate 35 forming the first layer is a thin film of about 100 Å in thickness. Erasing is performed by injecting electrons into floating gate 35. Writing is performed by removing electrons from floating gate 35. When floating gate 35 contains electrons injected thereinto, the memory cell transistor has a high threshold, and thus does not allow current flow. When electrons are removed from floating gate 35, the memory cell transistor has a low threshold, and allows current flow. A sense amplifier (not shown) reads this difference in current as information of 1/0.

The bit lines are divided into main bit line MBL and sub-bit line SBL. Main bit line MBL and sub-bit line SBL can be isolated by the select transistor. The select transistor also serves to isolate the blocks.

Referring to FIG. 5, an erasing method will be described below. Erasing is performed a block at a time. Block BLK0 is selected, and block BLK1 is not selected. A high voltage of about 12 V is applied to control gates 33 of all the memory cells in selected block BLK0. Thus, a high voltage of about 12 V is applied to word lines (not shown) connected to control gates 33 of all the memory cells in selected block BLK0. A negative voltage of about $-11$ V is applied to $N^+$ layers 29, i.e., sources of all the memory cells in selected block BLK0. A negative voltage of about $-11$ V is applied to P-well 39. By this application of the voltages, a high voltage higher than 20 V is applied across the word line (control gate 33) and P-well 39 in each memory cell of the selected block BLK0. Therefore, electrons are injected into floating gate 35 of the memory cell in selected block BLK0 owing to a tunneling phenomenon.

Control gates 33 of all the memory cells in unselected block BLK1 is at a potential of 0 V. Thus, the word lines (not shown) connected to control gates 33 of all the memory cells in unselected block BLK1 are at a potential of 0 V. $N^+$ layers 29, i.e., sources of all the memory cells in unselected block BLK1 are at a potential of 0V. Therefore, a tunneling phenomenon does not occur at unselected block BLK1. In selected block BLK0, a voltage of $-11$ V is applied to select gates 37. In unselected block BLK1, select gate 37, N-well 41 and the P-type semiconductor substrate are at a potential of 0 V. Main bit line MBL is floated.

In selected block BLK0 shown in FIG. 6, a voltage of 12 V is applied to main bit line MBL, and a voltage of 12 V is applied to select gate 37 of the select transistor. Also, in selected block BLK0, a voltage of $-11$ V is applied to the selected word line. Thus, a voltage of $-11$ V is applied to control gate 33 connected to the selected word line. By this application of the voltages, electrons tunnels from floating gate 35 of the selected memory cell in selected block BLK0. Removal of electrons can be prevented by setting the potential on main bit line MBL to 0 V. This enables storage of information of 1/0.

Figure 7:
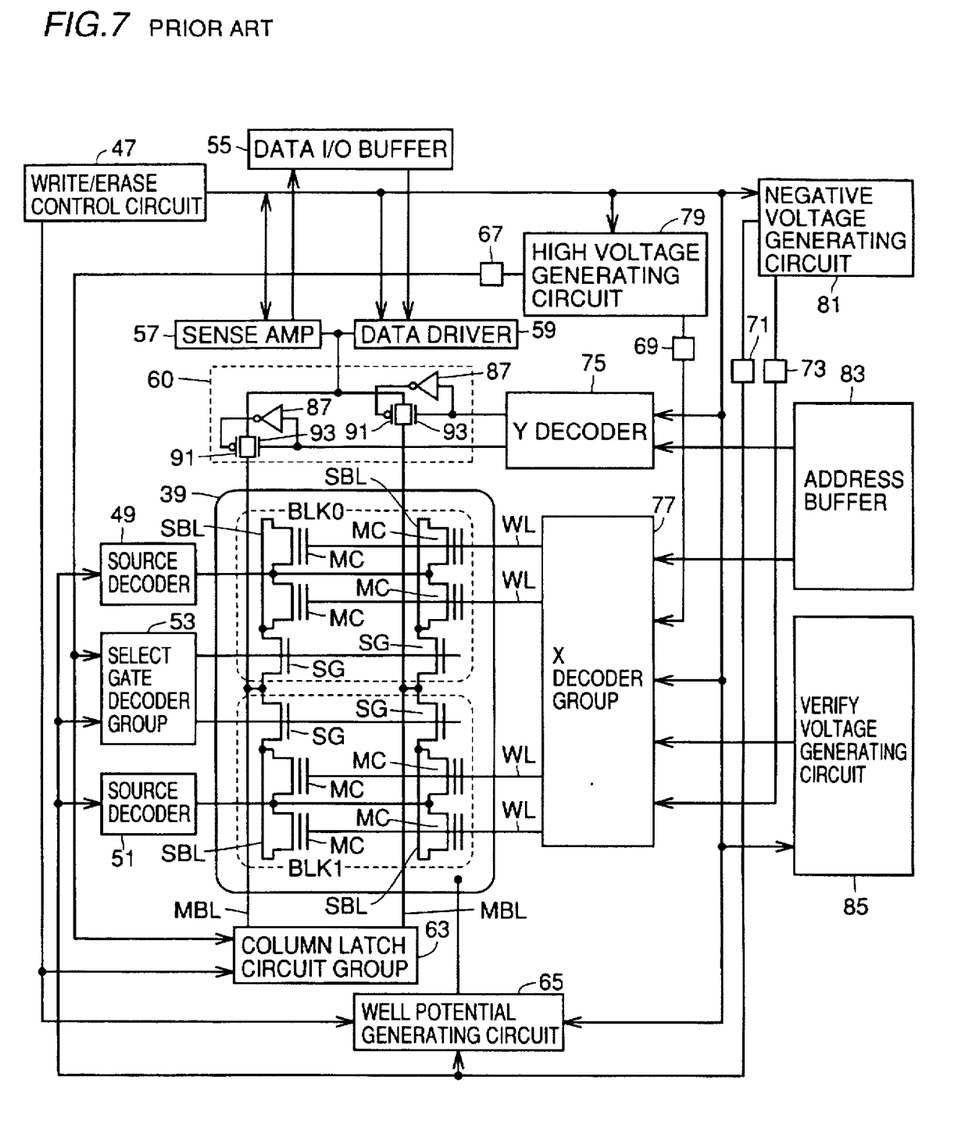
FIG. 7 is a schematic block diagram showing a whole structure of the conventional DINOR flash memory.

FIG. 7 is a schematic block diagram showing a whole structure of a DINOR flash memory which is an example of the nonvolatile semiconductor memory device in the prior art. Portions similar to those in FIG. 5 bear the same reference characters, and will not be described below. Referring to FIG. 7, the DINOR flash memory in the prior art includes a write/erase control circuit 47, source decoders 49 and 51, a select gate decoder group 53, a data I/O buffer 55, sense amplifiers 57, a data driver 59, a Y-gate 60, blocks BLK0 and BLK1, a column latch circuit group 63, a well potential generating circuit 65, a Y-decoder 75, an X-decoder group 77, a high voltage generating circuit 79, a negative voltage generating circuit 81, switching circuits 67, 69, 71 and 73, an address buffer 83 and a verify voltage generating circuit 85.

Y-gate 60 includes a PMOS transistor 91, an NMOS transistor 93 and an inverter 87. PMOS transistor 91 and NMOS transistor 93 form a transfer gate. The transfer gate having the above structure is generally called a complementary (CMOS) transfer gate.

Blocks BLK0 and BLK1 are formed on the same P-well 39. Each of blocks BLK0 and BLK1 includes memory cells MC, select transistors SG, word lines WL, sub-bit lines SBL and main bit lines MBL. Memory cell MC and select transistor SG are the same as the stacked gate memory cell and the select transistor already described with reference to FIG. 5, respectively.

Source decoder 49 corresponds to block BLK0. Source decoder 51 corresponds to block BLK1. Select gate decoder group 53 includes two select gate decoders (not shown), which correspond to two blocks BLK0 and BLK1, respectively. X-decoder group 77 includes two X-decoders (not shown), which correspond to two blocks BLK0 and BLK1, respectively. Column latch circuit group 63 includes two latch circuits (not shown), which correspond to two main bit lines MBL, respectively.

A control gate of memory cell MC is connected to word line WL. A source of memory cell MC in block BLK0 is connected to source decoder 49. A source of memory cell MC in block BLK1 is connected to source decoder 51. A drain of memory cell MC is connected to sub-bit line SBL. A select gate of select transistor SG is connected to select gate decoder group 53. One of source/drain of select transistor SG is connected to sub-bit line SBL, and the other is connected to main bit line MBL. Column latch circuit group 63 is provided for temporarily storing data to be written into memory cell MC. Data input into column latch circuit group 63 is performed by data driver 59 arranged at column side. Well potential generating circuit 65 controls a potential on P-well 39. Sense amplifier 57 reads data from memory cell MC. Y-decoder 75 selects main bit line MBL. Verify voltage generating circuit 85 supplies to the word line a voltage (verify voltage) different from an ordinary read voltage in order to check whether or not electrons are removed to attain a predetermined threshold during writing of data into memory cell MC.

High voltage generating circuit 79 supplies a high voltage to select gate decoder group 53 and column latch circuit group 63, when switching circuit 67 is on. For example, high voltage generating circuit 79 supplies a high voltage to select gate decoder group 53 when writing data into memory cell MC. Further, high voltage generating circuit 79 supplies a high voltage to X-decoder group 77 when switching circuit 69 is on. For example, high voltage generating circuit 79 supplies a high voltage to X-decoder group 77 during an erase operation. Negative voltage generating circuit 81 supplies a negative voltage to well potential generating circuit 65, source decoders 49 and 51, and select gate decoder group 53 when switching circuit 71 is on. For example, negative voltage generating circuit 81 supplies a negative voltage to well potential generating circuit 65, select gate decoder group 53, and source decoders 49 and 51 during the erase operation. Further, negative voltage generating circuit 81 supplies a negative voltage to X-decoder group 77 when switching circuit 73 is on. For example, negative voltage generating circuit 81 supplies a negative voltage to X-decoder group 77 during data writing into memory cell MC.

Write/erase control circuit 47 controls operations of writing data into memory cell MC and erasing data thereof. X-decoder group 77 selects word line WL. Source decoder 49 supplies a negative voltage to the source of memory cell transistor MC, when block BLK0 is selected and data of memory cell MC in block BLK0 is to be erased. Source decoder 51 operates similarly to source decoder 49. Source gate decoder group 53 supplies a negative voltage to the select gate of select transistor SG in the selected block for the erase operation, and supplies a high voltage to the same for the write operation.

For the sake of illustration, FIG. 7 shows two blocks, each including four memory cells. In practice, however, more than two blocks are arranged, and each block includes more than four memory cells. Also, more main bit lines, sub-bit lines and word lines are arranged correspondingly to the number of memory cells.

In some of flash memories, a latch circuit is arranged for each bit line. These latch circuits temporarily store a large number of write data for simultaneously writing these large number of write data in parallel into a large number of memory cells, respectively.

Figure 8:
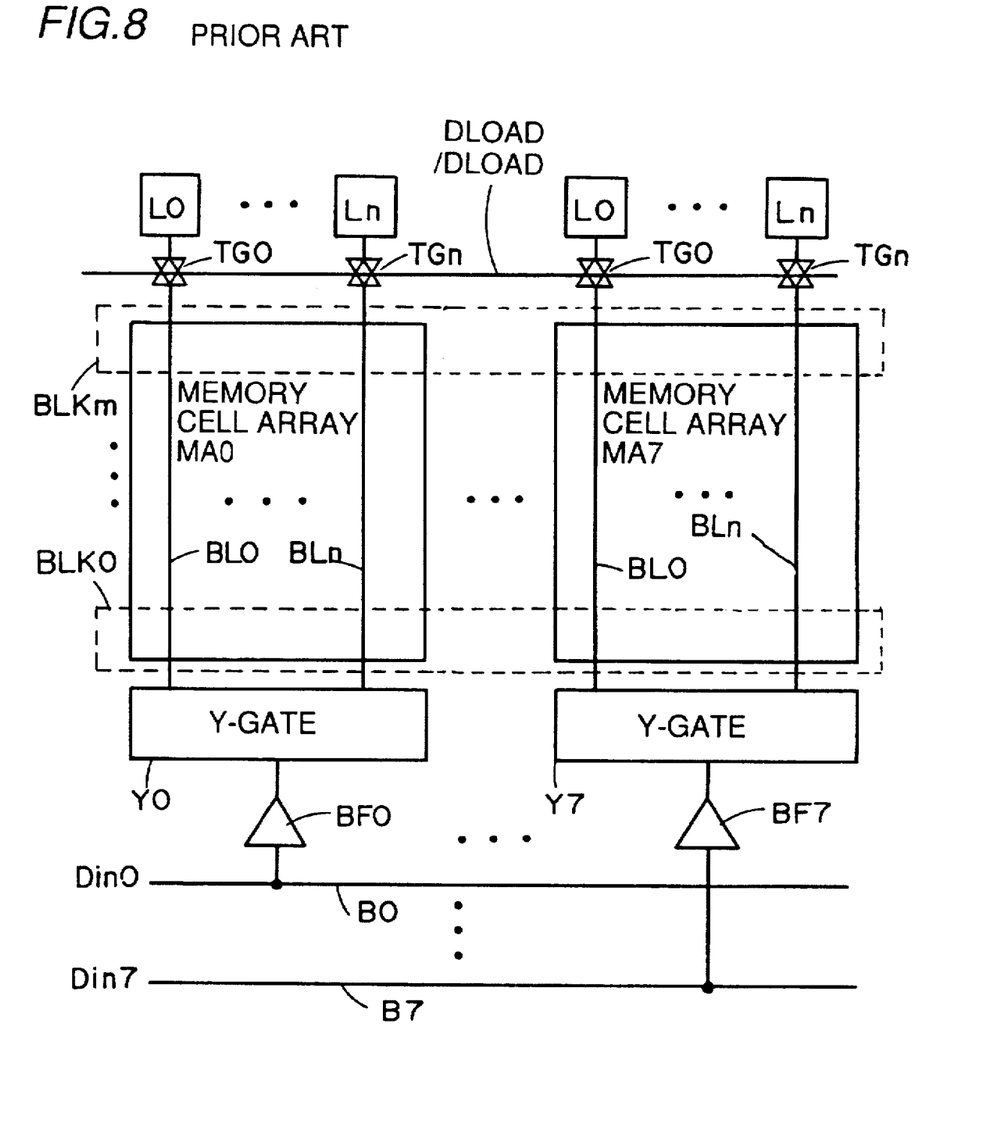
FIG. 8 shows data loading into a latch circuit in the conventional DINOR flash memory.

FIG. 8 shows data loading into latch circuits which are provided correspondingly to bit lines in a conventional DINOR flash memory, respectively. Referring to FIG. 8, the conventional DINOR flash memory includes memory cell arrays MA0–MA7, Y-gates Y0–Y7, buffers BF0–BF7 and input data buses B0–B7. Each of memory cell arrays MA0–MA7 includes bit lines BL0–BLn. Each of memory cell arrays MA0–MA7 is divided into blocks BLK0–BLKm. The conventional DINOR flash memory includes transfer gates TG0–TGn and latch circuits L0–Ln, which are provided correspondingly to bit lines BL0–BLn, respectively. Each of blocks BLK0–BLKm is similar to block BLK0 in FIG. 7. Each of bit lines BL0–BLn is similar to main bit line MBL in FIG. 7. Each of Y gates Y0–Y7 is similar to Y-gate 60 in FIG. 7. Each of buffers BF0–BF7 is similar to data driver 59 in FIG. 7.

Data loading will be described below. All transfer gates TG0–TGn, which are connected to bit lines BL0–BLn provided at memory cell arrays MA0–MA7, are turned on in accordance with load signals DLOAD and /DLOAD. Bit lines BL0 in memory cell arrays MA0–MA7 are selected in accordance with an incoming address signal. Selected bit line BL0 included in memory cell array MA0 receives input data Din0 from corresponding input data bus B0 through corresponding buffer BF0 and Y gate Y0. Input data Din0 sent to selected bit line BL0 included in selected memory cell array MA0 is latched by corresponding latch circuit L0. In this manner, selected bit line BL0 supplies data Din0 to be loaded into latch circuit L0, and writes the same into latch circuit L0, whereby the data is loaded. Loading of data into latch circuits L0, which are connected to selected bit lines BL0 included in memory cell arrays MA1–MA7, is performed in the same manner as the loading of data into latch circuit L0 connected to selected bit line BL0 included in memory cell array MA0. Thus, data are simultaneously loaded into eight latch circuits L0 connected to eight selected bit lines BL0, respectively.

Then, in accordance with the address signals supplied to the memory cell arrays, bit lines BL1 are selected in memory cell arrays MA0–MA7, respectively. Data loading into latch circuits L1 connected to selected bit lines BL1 is performed in the same manner as the data loading into latch circuits L0 described above. Then, in accordance with the incoming address signal, bit lines BL2 are selected in memory cell arrays MA0–MA7, respectively. Data loading into latch circuits L2 connected to selected bit lines BL2 is performed similarly to the data loading into latch circuits L0 described above. In this manner, bit lines BL0–BLn in each of memory cell arrays MA0–MA7 are successively selected in the order from bit line BL0 to bit line BLn, whereby data are loaded into all latch circuits L0–Ln.

Figure 9:
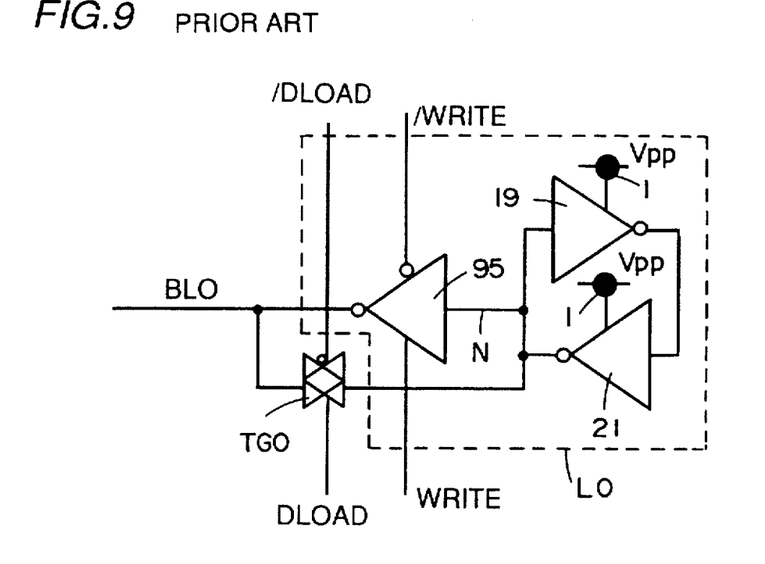
FIG. 9 is a circuit diagram specifically showing the latch circuit L0 in FIG. 8 and also showing a transfer gate TG0.

FIG. 9 is a circuit diagram showing a specific structure of latch circuit L0 in FIG. 8 and transfer gate TG0. Portions similar to those in FIG. 8 bear the same reference characters, and will not be specifically described below. Referring to FIG. 9, latch circuit L0 includes a clocked inverter 95, and inverters 19 and 21. Inverters 19 and 21 form a latch unit receiving a high voltage Vpp from a power supply 1. Clocked inverter 95 is arranged between bit line BL0 and a node N, and receives write signals WRITE and /WRITE. Transfer gate TG0 is arranged between bit line BL0 and node N, and receives load signals DLOAD and /DLOAD. This transfer gate TG0 is similar to the transfer gate in FIG. 7 formed of PMOS transistor 91 and NMOS transistor 93. A PMOS transistor (not shown) forming transfer gate TG0 receives load signal /DLOAD on its gate, and NMOS transistor (not shown) forming transfer gate TG0 receives load signal DLOAD on its gate. Latch circuits L1–Ln and transfer gates TG1–TGn have the same structures as latch circuit L0 and transfer gate TG0.

Figure 10:
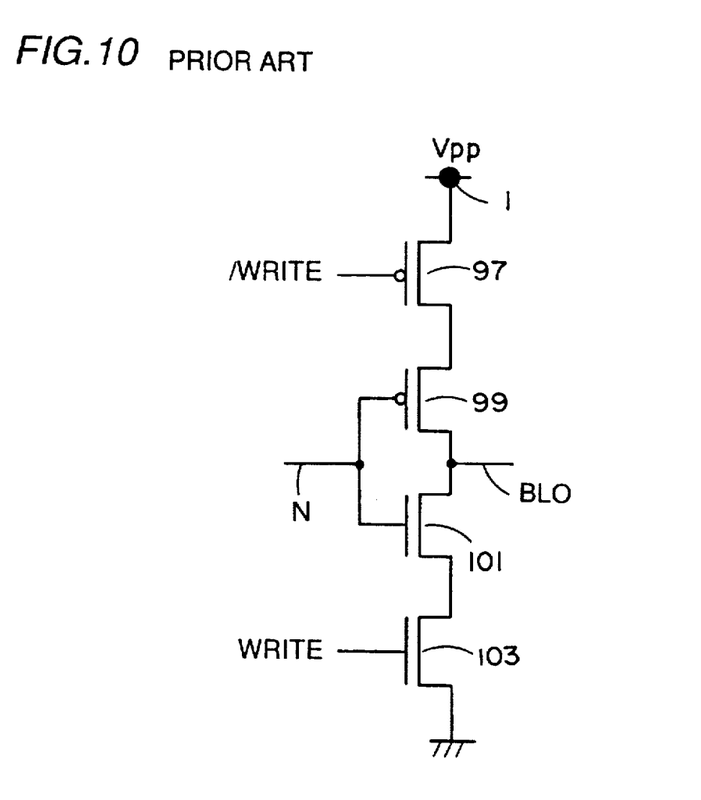
FIG. 10 is a circuit diagram specifically showing a clocked inverter in FIG. 9.

FIG. 10 is a circuit diagram showing a specific structure of clocked inverter 95 in FIG. 9. Portions similar to those in FIG. 9 bear the same reference characters, and will not be described below. Referring to FIG. 10, the clocked inverter is formed of PMOS transistors 97 and 99, and NMOS transistors 101 and 103. Referring to FIGS. 9 and 10, when data is to be loaded into latch circuit L0 in memory cell array MA0 (FIG. 8), transfer gate TG0 is turned on to connect bit line BL0 to node N. Data Din0 received on bit line BL0 is latched by the latch unit formed of inverters 19 and 21. In the data load operation, write signal /WRITE is at H-level, and write signal WRITE is at L-level. When data loaded into latch circuit L0 is to be written into the memory cell (not shown), transfer gate TG0 is turned off. Clocked inverter 95 is supplied with write signal /WRITE at L-level and write signal WRITE at H-level. Thereby, data loaded into latch circuit L0 is applied onto bit line BL0.

In the conventional DINOR flash memory, the latch circuit connected to the bit line corresponding to the selected address is supplied with data from the bit line corresponding to the selected address as described above, whereby data loading is performed. Thus, address information and data are merged at the bit line itself, and data to be loaded into the latch circuit is latched through the transfer gate arranged corresponding to the latch circuit. Therefore, many bit lines are charged with electric charges, when data are loaded into all latch circuits L0–Ln connected to bit lines BL0–BLn in memory cell arrays MA0–MA7. As one of functions of the flash memory, there is a mode in which data is read from the memory cell array immediately after data loading. In this mode, a reading speed is disadvantageously reduced due to electric charges charged onto the many bit lines. In the data load operation, all transfer gates TG0–TGn connected to bit lines BL0–BLn in memory cell arrays MA0–MA7 are on. Therefore, the bit lines connected to the latch circuits of which data loading is completed must keep the charged electric charges until data loading into other latch circuits is completed.

As another function of the flash memory, there is a mode in which data loading is effected on only a part of latch circuits, and data loading will be effected on the other latch circuits after processing such as reading of data from the memory cell array. In this case, even when data loading is to be effected on only a part of latch circuits, all transfer gates TG0–TGn connected to bit lines BL0–BLn in memory cell arrays MA0–MA7 are turned on. When data loading is to be performed later, therefore, the latch circuits of which data loading is already completed are connected to the bit lines. As a result, data of the latch circuits of which data loading is already completed may be destroyed due to floating capacities of the bit lines.

In the conventional DINOR flash memory, data is loaded into the latch circuit by forcedly inverting the latch circuit. Therefore, a potential having a sufficiently large drive power must be supplied to the bit line. Therefore, Y-gates Y0–Y7 must use complementary (CMOS) transfer gates. This results in a problem of increasing a circuit area.

SUMMARY OF THE INVENTION

An object of the invention is to provide a nonvolatile semiconductor memory device, overcoming the above-mentioned problems, wherein rapid data reading can be performed even in a mode for reading data from a memory cell array immediately after a data load mode.

Another object of the invention is to provide a nonvolatile semiconductor memory device, in which data already loaded into a part of latch circuits are not destroyed even in such a mode that other latch circuits are loaded with data after completion of the previous loading of data only into the above part of latch circuits.

Still another object of the invention is to provide a nonvolatile semiconductor memory device, of which circuit area can be reduced.

A nonvolatile semiconductor memory device according to the invention includes a memory cell array. The memory cell array includes a plurality of bit lines, and stacked gate memory cells provided correspondingly to the bit lines. The nonvolatile semiconductor memory device also includes a plurality of latch circuits and a data line. The plurality of latch circuits are arranged correspondingly to the plurality of bit lines. Each latch circuit is provided for writing data to be loaded. Data line is arranged correspondingly to the memory cell array. The data line is operable to supply the data to be loaded into the plurality of latch circuits.

According to the nonvolatile semiconductor memory device of the invention, data loading is performed in such a manner that a potential on only the bit line corresponding to a selected address is set to a predetermined level, and the data to be loaded is supplied from the data line, which is arranged independently of the bit line, to the latch circuit connected to the bit line set to the predetermined level. Thus, the bit lines carry only address information. Therefore, data previously loaded into a part of latch circuits are not destroyed in such a made that data are loaded into the other latch circuits after completion of the data loading into the above part of latch circuits.

According to the nonvolatile semiconductor memory device of the invention, the bit lines carry only the address information, and the data to be loaded are supplied from the data line to the latch circuits. Therefore, it is not necessary to invert forcedly the latch circuits by the potentials on the bit lines, and thus it is not necessary to supply to the bit lines the potential having a sufficiently large drive power. Accordingly, the circuit area can be reduced.

Preferably, in the nonvolatile semiconductor memory device of the invention, all the bit lines are reset upon every completion of the data loading into the latch circuit corresponding to the bit line corresponding to the selected address. Therefore, reading can be performed rapidly in an operation of reading the data from the memory cell array immediately after completion of the data loading into all the latch circuits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A DINOR flash memory, which is an example of a nonvolatile semiconductor memory device of the invention, will be described below with reference to the drawings.

Figure 1:
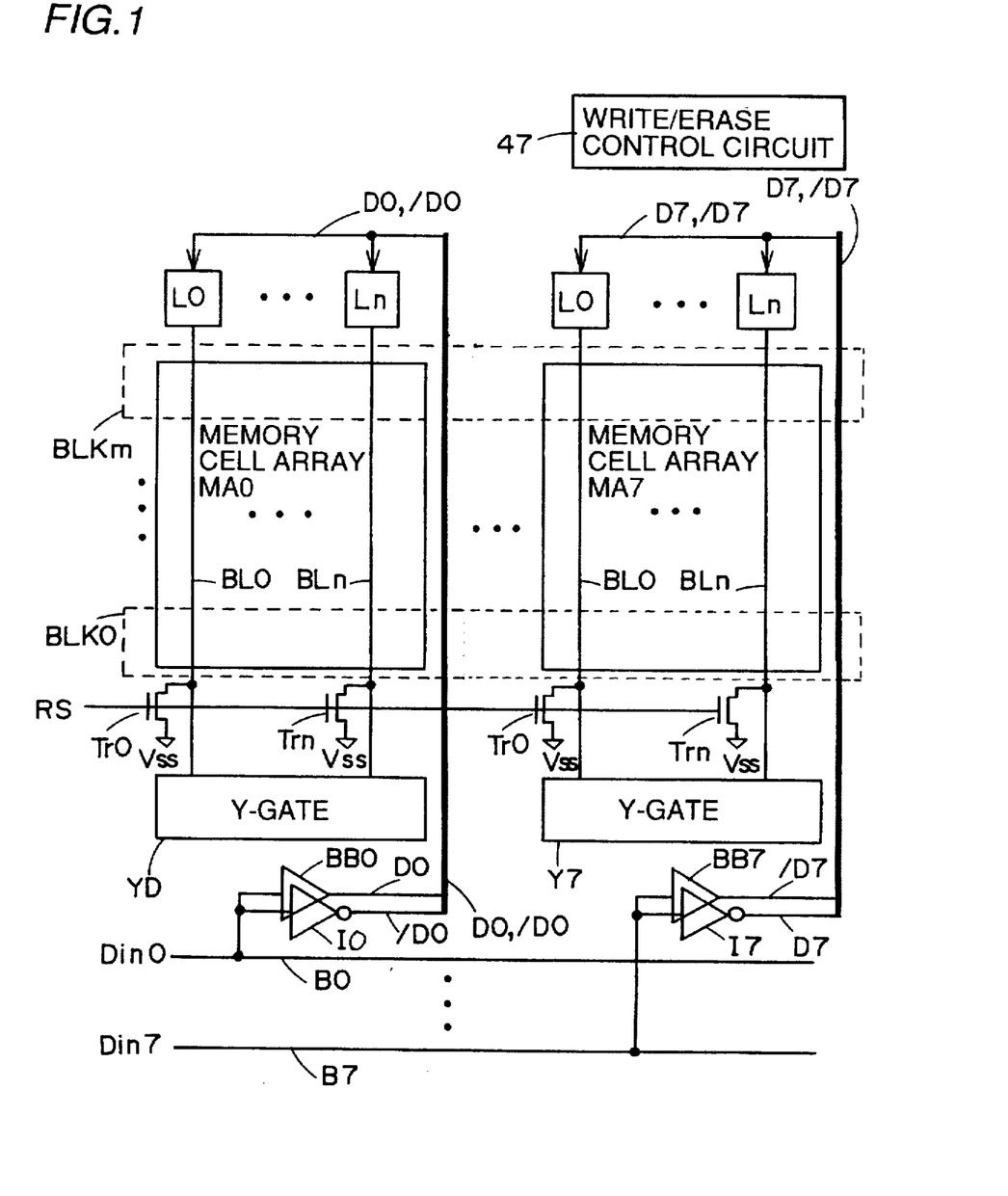
FIG. 1 is a schematic block diagram showing a whole structure of a DINOR flash memory of an embodiment of the invention.

FIG. 1 is a schematic block diagram showing a whole structure of a DINOR flash memory of an embodiment of the invention. Referring to FIG. 1, the DINOR flash memory of the embodiment includes memory cell arrays MA0–MA7, a write/erase control circuit 47, data lines D0 and /D0–D7 and /D7, Y-gates Y0–Y7, buffers BB0–BB7, inverters I0–I7 and input data buses B0–B7. Each of memory cell arrays MA0–MA7 includes bit lines BL0–BLn. Each of memory cell arrays MA0–MA7 is divided into blocks BLK0–BLKm. The DINOR flash memory of the embodiment further includes latch circuits L0–Ln and NMOS transistors Tr0–Trn, which are arranged correspondingly to bit lines BL0–BLn, respectively. Here, NMOS transistors Tr0–Trn form reset circuits.

Although not shown, the DINOR flash memory of the embodiment includes circuits which have functions similar to those of data I/O buffer 55, sense amplifier 57, Y-decoder 75, source decoders 49 and 51, select gate decoder group 53, well potential generating circuit 65, X-decoder group 77, verify voltage generating circuit 85, address buffer 83, switching circuits 67–73, high voltage generating circuit 79 and negative voltage generating circuit 81. Each of memory cell arrays MA0–MA7 has a plurality of stacked gate memory cells MC similar to those shown in FIGS. 5 to 7. Each of blocks BLK0–BLKM is similar to block BLK0 in FIG. 7. Each of bit lines BL0–BLn is similar to main bit line MBL in FIG. 7. Latch circuits L0–Ln correspond to column latch circuit group 63 in FIG. 7, but have circuit structures different from those of column latch circuit group 63 in FIG. 7. Each of Y-gates Y0–Y7 corresponds to Y-gate 60 in FIG. 7, but has a circuit structure different from that of Y-gate 60 in FIG. 7. Buffer BB0 and inverter I0 correspond to data driver 59 in FIG. 7, but have different circuit structures. The same is true with respect to buffers BB1–BB7 and inverters I1–I7. Write/erase control circuit 47 corresponds to write/erase control circuit 47 in FIG. 7.

Operation of the DINOR flash memory in FIG. 1 will be briefly described below. In an operation of writing data to be loaded into latch circuits L0–Ln provided correspondingly to bit lines BL0–BLn, a potential at H-level is set only at the bit lines corresponding to the selected address, and data are supplied from data lines D0 and /D0 to D7 and /D7, which are provided independently of the bit lines, to the latch circuits connected to the bit lines which correspond to the selected address. Thus, bit lines BL0–BLn carry only address information. In contrast to this, address information and data are merged at bit lines BL0–BLn in the conventional DINOR flash memory shown in FIG. 8.

Figure 2:
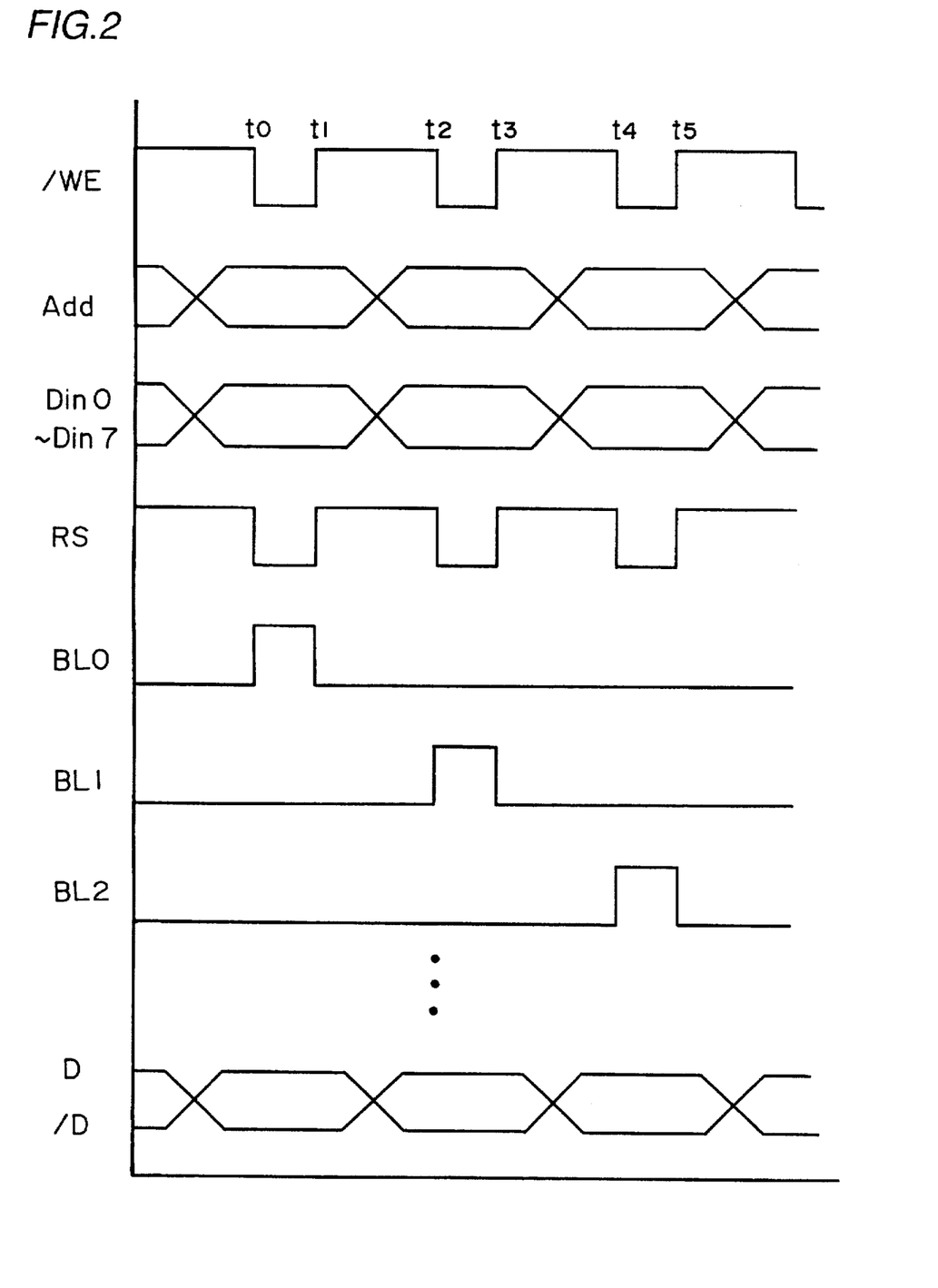
FIG. 2 is a timing chart showing an operation of the DINOR flash memory in FIG. 1.

FIG. 2 specifically shows the operation of the DINOR flash memory of the embodiment. Referring to FIGS. 1 and 2, it is assumed that the bit line BL0 corresponds to a selected address Add when a write enable signal /WE attains L-level at time t0. Write enable signal /WE is externally supplied for controlling writing of data into memory cell arrays MA0–MA7. A reset signal RS is sent to gates of NMOS transistors Tr0–Trn, and is synchronized with write enable signal /WE. When write enable signal /WE attains L-level at time t0, reset signal RS also attains L-level. All NMOS transistors Tr0–Trn are turned off. Since it is only bit line BL0 that corresponds to selected address Add at time t0, the potential on only bit line BL0 in each of memory cell arrays MA0–MA7 is set to H-level. In order to set the potentials of bit lines BL0 corresponding to selected address Add to H-level, the potential is supplied thereto through Y-gates Y0–Y7. Each of Y-gates Y0–Y7 is formed of MOS transistors MT0–MTn (not shown) connected to bit lines BL0–BLn, respectively.

Since only bit line BL0 is set to the potential at H-level in each of memory cell arrays MA0–MA7 at time t0, data to be loaded are supplied to latch circuits L0 connected to bit lines BL0 at H-level through data lines D0 and /D0–D7 and /D7.

Data loading at time t0 will be described below particularly in connection with memory cell array MA0. Input data Din0 supplied to input data bus B0 is sent, as data D, to data line DO through buffer BB0. Input data Din0 is inverted by inverter IO, and is applied to data line /D0 as data /D. Data /D is formed by inverting data D, and data D and /D are called complementary data. As described above, data Din0 to be loaded into latch circuit L0 is supplied, as complementary data D and /D, to latch circuit L0 through data lines D0 and /D0. Data loading into latch circuits L0 connected to bit lines BL0 in memory cell arrays MA1–MA7 is performed similarly to the data loading into latch circuit L0 connected to bit line BL0 in memory cell array MA0.

At time t1, write enable signal /WE attains H-level, and reset signal RS also attains H-level. Therefore, all NMOS transistors Tr0–Trn connected to bit lines BL0–BLn in memory cell arrays MA0–MA7 are turned on. Therefore, all bit lines BL0–BLn are supplied with a ground voltage Vss, and all bit lines BL0–BLn attain L-level. Thus, all bit lines BL0–BLn are reset.

At time t2, write enable signal /WE attains L-level again, and reset signal RS also attains L-level. Therefore, all NMOS transistors Tr0–Trn connected to bit lines BL0–BLn in memory cell arrays MA0–MA7 are turned off. It is now assumed that bit line BL1 corresponds to selected address Add at time t2. At this case, only bit lines BL1 in memory cell arrays MA0–MA7 attain the potential at H-level. Similarly to data loading into latch circuit L0, therefore, latch circuits L1 connected to bit lines BL1 at H-level are supplied with data Din0–Din7 to be loaded through data lines D0 and /D0–D7 and /D7, respectively.

At time t3, write enable signal /WE attains H-level, and reset signal RS also attains H-level. Therefore, NMOS transistors Tr0–Trn connected to bit lines BL0–BLn in memory cell arrays MA0–MA7 are turned on. Consequently, all bit lines BL0–BLn are supplied with ground potential Vss, and bit lines BL0–BLn attain L-level. Thus, all bit lines BL0–BLn are reset.

At time t4, write enable signal /WE attains L-level, and reset signal RS also attains L-level. Therefore, all NMOS transistors Tr0–Trn connected to bit lines BL0–BLn in memory cell arrays MA0–MA7 are turned off. It is assumed that bit line BL2 corresponds to selected address Add at time t4. In this case, only bit lines BL2 in memory cell arrays MA0–MA7 attain the potential at H-level. Consequently, latch circuits L2 connected to bit lines BL2 are supplied with data Din0–Din7 through data lines D0 and /D0–D7 and /D7, respectively.

When write enable signal /WE attains H-level at time t5, reset signal RS also attains H-level. All NMOS transistors Tr0–Trn connected to bit lines BL0–BLn in memory cell arrays MA0–MA7 are turned on. Consequently, all bit lines BL0–BLn are supplied with ground voltage Vss, and therefore attain L-level. Thus, all bit lines BL0–BLn are reset.

Description has been given on the data loading into latch circuits L0–L2 connected to bit lines BL0–BL2 in memory cell arrays MA0–MA7. Similarly to the above operation, data loading into latch circuits L3–Ln connected to bit lines BL3–BLn in memory cell arrays MA0–MA7 is performed in accordance with write enable signal /WE at and after time t5.

Figure 3:
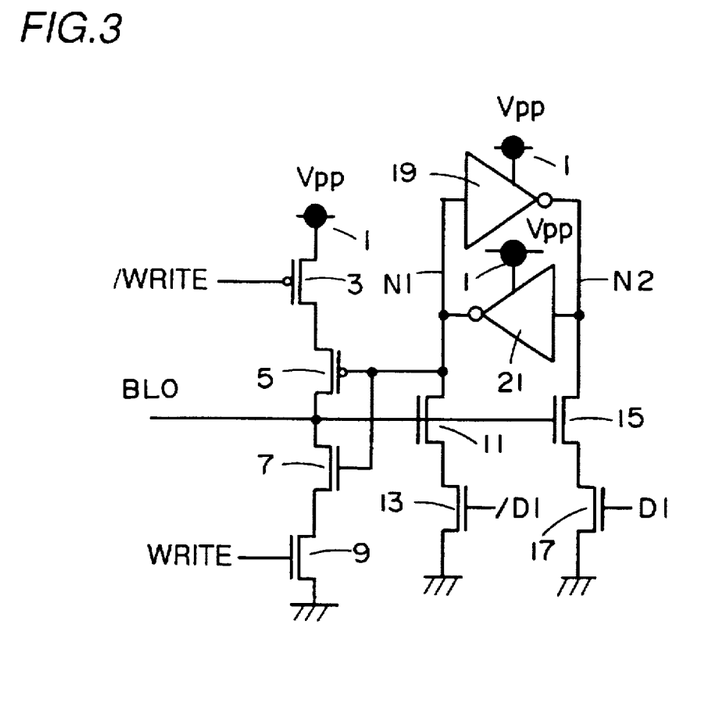
FIG. 3 is a circuit diagram specifically showing a latch circuit L0 in FIG. 1.

FIG. 3 is a circuit diagram specifically showing latch circuit L0 connected to bit line BL0 in memory cell array MA0 in FIG. 1. Portions similar to those in FIG. 1 bear the same reference characters, and will not be described below. Referring to FIG. 3, latch circuit L0 includes PMOS transistors 3 and 5, NMOS transistors 7, 9, 11, 13, 15 and 17, and inverters 19 and 21. PMOS transistors 3 and 5 and NMOS transistors 7 and 9 are connected in series between a node having high voltage Vpp supplied from power supply 1 and a node having the ground voltage. PMOS transistor 3 receives write signal /WRITE on its gate. NMOS transistor 9 receives write signal WRITE on its gate. Gates of PMOS and NMOS transistors 5 and 7 are connected to a node N1. NMOS transistors 11 and 13 are connected in series between node N1 and a node having the ground voltage. A gate of NMOS transistor 11 is connected to bit line BL0. A gate of NMOS transistor 13 is connected to data line /D1. NMOS transistors 15 and 17 are connected in series between a node N2 and a node having the ground potential. A gate of NMOS transistor 15 is connected to bit line BL0. A gate of NMOS transistor 17 is connected to data line D1. An output node of inverter 21 is connected to node N1. An input node thereof is connected to node N2. An output node of inverter 19 is connected to node N2, and an input node thereof is connected to node N1. Inverters 19 and 21 form a latch unit. Inverters 19 and 21 are supplies with high voltage Vpp from power supply 1. One of source/drain of NMOS transistor 7 and one of source/drain of PMOS transistor 5 are connected to bit line BL0.

Data loading into latch circuit L0 will be described below. Write/erase control circuit 47 (FIG. 1) supplies write signal /WRITE at H-level and write signal WRITE at L-level to gates of PMOS and NMOS transistor 3 and 9, respectively. When data is to be loaded into latch circuit L0, bit line BL0 attains H-level. Therefore, NMOS transistors 11 and 15 are turned on. Since data line /D1 supplies an input to the gate of NMOS transistor 13, NMOS transistor 13 is turned on/off in accordance with the level of complementary data /D applied to data line /D1. Since data line D1 supplies an input to the gate of NMOS transistor 17, NMOS transistor 17 is turned on/off in accordance with the level of complementary data D applied to data line D1. For example, when input data Din0 exhibits H-level, data line D1 carries a potential at H-level, and data line /D1 carries a potential at L-level. Therefore, NMOS transistor 17 is turned on to supply the ground voltage to a node N2, so that node N2 attains L-level. Therefore, node N1 attains H-level. Bit line BL0 is set to L-level, and NMOS transistors 11 and 15 are turned off. In this manner, data Din0 to be loaded is written into latch circuit L0. When input data Din0 exhibits L-level, the operation is performed similarly.

When data latched into latch circuit L0 is to be written into memory cell (not shown) in memory cell array MA0, write/erase control circuit 47 supplies write signal /WRITE at L-level and write signal WRITE at H-level to gates of PMOS and NMOS transistors 3 and 9, respectively. The potential corresponding to the potential level on node N1 is applied to bit line BL0. When data in the latch circuit is to be written into the memory cell, data lines D1 and /D1 carry potentials at L-level. Latch circuits L1–Ln connected to bit lines BL1–BLn in memory cell array MA0 as well as latch circuits L0–Ln connected to bit lines BL0–BLn in memory cell arrays MA1–MA7 have the same circuit structures as that of latch circuit L0 in FIG. 3.

Figure 4:
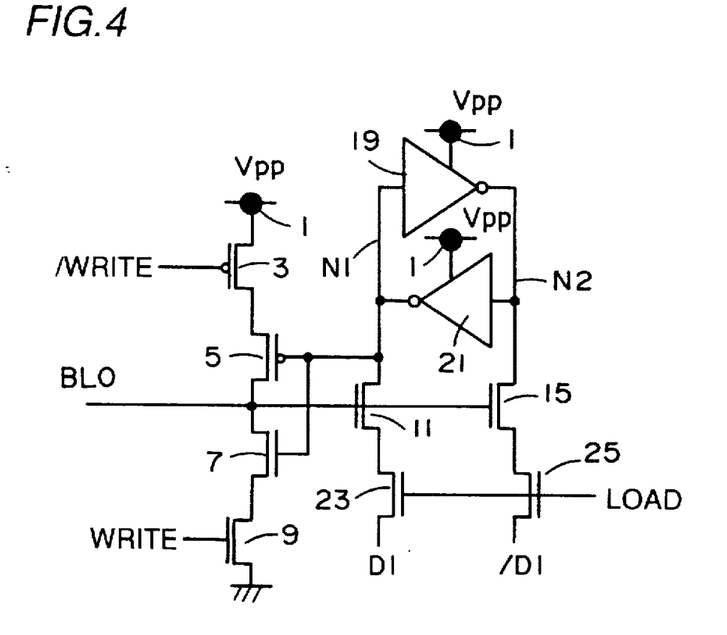
FIG. 4 is a circuit diagram specifically showing another example of the latch circuit L0 in FIG. 1.

FIG. 4 is a circuit diagram specifically showing another example of latch circuit L0 connected to bit line BL0 in memory cell array MA0 in FIG. 1. Portions similar to those in FIG. 3 bear the same reference characters, and will not be described below. Referring to FIG. 4, latch circuit L0 includes PMOS transistors 3 and 5, NMOS transistors 7, 9, 11, 23, 15 and 25, and inverters 19 and 21. NMOS transistors 11 and 23 are connected in series between node N1 and data line D1. NMOS transistors 15 and 25 are connected in series between node N2 and data line /D1. NMOS transistors 23 and 25 receive load signal LOAD on their gates.

Data loading into latch circuit L0 will be described below. Write/erase control circuit 47 supplies write signal /WRITE at H-level and write signal WRITE at L-level to gates of PMOS and NMOS transistors 3 and 9, respectively. Since bit line BL0 is at H-level, NMOS transistors 11 and 15 are on. Write/erase control circuit 47 supplies load signal LOAD at H-level to gates of NMOS transistors 23 and 25. Thereby, the potential on data line D1 is applied to node N1, and the potential on data line /D1 is applied to node N2. For example, when input data Din0 exhibits H-level, data line D1 is at H-level, and data line /D1 is at L-level. Therefore, node N1 is at H-level and node N2 is at L-level. Bit lines BL0 is at L-level, and NMOS transistors 11 and 15 are off. In this manner, data Din0 to be loaded is written into latch circuit L0. When input data Din0 exhibits L-level, the operation is performed similarly.

When data at latch circuit L0 is to be written into the memory cell, write/erase control circuit 47 supplies write signal /WRITE at L-level and write signal WRITE at H-level to gates of PMOS and NMOS transistors 3 and 9, respectively. Consequently, the potential corresponding to the potential level on node N1 is supplied to bit line BL0. Load signal LOAD is at L-level. Latch circuits L1–Ln connected to bit lines BL1–BLn in memory cell array MA0 as well as latch circuits L0–Ln connected to bit lines Bl0–BLn in memory cell arrays MA1–MA7 have the same circuit structures as latch circuit L0 shown in FIG. 4.

According to the DINOR flash memory of the embodiment, as described above, the potential at H-level is set at only the bit line connected to the latch circuit into which data is to be loaded, so that only one bit line is charged in each of memory cell arrays MA0–MA7. Thus, only eight bit lines are charged as a whole. Thus, only the bit lines corresponding to the bus width of data are charged. Further, all bit lines BL0–BLn in memory cell arrays MA0–MA7 are reset upon every completion of loading of data of 1 byte. Consequently, in the DINOR flash memory of the embodiment, charges are completely discharged from bit lines BL0–BLn in memory cell arrays MA0–MA7, and therefore data reading can be rapidly performed in the mode where data are read from memory cell arrays MA0–MA7 immediately after data loading.

In contrast to the conventional DINOR flash memory, the DINOR flash memory of the embodiment does not operate in such a manner that data are directly supplied to the latch circuits through the transfer gates from the bit lines, but operates in such a manner that the bit lines carry only the address information, and data to be loaded are supplied to the latch circuits from data lines D0 and /D0–D7 and /D7. Consequently, in the DINOR flash memory of the embodiment, data already loaded into a part of latch circuits are not destroyed even in such a mode that data are loaded into the other latch circuits after completion of data loading into the above part of latch circuits and processing such as reading of data from memory cell arrays MA0–MA7.

Further, in the DINOR flash memory of the embodiment, data loading into the latch circuits is performed by controlling the gates of NMOS transistors 11 and 15 (FIGS. 3 and 4). In contrast to the conventional DINOR flash memory, therefore, a high current supply power is not required for supplying a voltage to the bit lines, and it is required only to supply a voltage higher than threshold voltages of NMOS transistors 11 and 15 to the bit lines corresponding to the selected address. Consequently, in the DINOR flash memory of the embodiment, it is not necessary to provide Y-gates Y0–Y7 formed of complementary (CMOS) transfer gates, which is required in the conventional DINOR flash memory, and it is required only to provide one MOS transistor for each bit line. Therefore, a circuit area can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a memory cell array, said memory cell array including, a plurality of bit lines, and stacked gate memory cells provided correspondingly to said bit lines;

a plurality of latch means arranged correspondingly to said plurality of bit lines and each provided for writing data to be loaded; and a data line arranged correspondingly to said memory cell array for supplying said data to be loaded into said plurality of latch means, wherein a potential on only said bit line corresponding to a selected address is set to a predetermined level, and said data to be loaded is supplied from said data line to said latch means corresponding to said bit line set to said predetermined level.

2. The nonvolatile semiconductor memory device according to claim 1, further comprising reset means for resetting said plurality of bit lines upon every completion of writing of said data to be loaded into said latch means corresponding to said bit line corresponding to the selected address.

3. The nonvolatile semiconductor memory device according to claim 1, wherein said latch means includes a latch unit for holding said data, and switching means arranged between said latch unit and said data line, wherein said switching means is turned on in response to setting of the potential on said corresponding bit line to said predetermined level, and thereby supplies said data to be loaded from said latch unit onto said data line.

4. The nonvolatile semiconductor memory device according to claim 2, wherein said latch means includes a latch unit for holding said data, and switching means arranged between said latch unit and said data line, wherein said switching means is turned on in response to setting of the potential on said corresponding bit line to said predetermined level, and thereby supplies said data to be loaded from said latch unit onto said data line.

* * * * *